(12) United States Patent
Ishiwata

(10) Patent No.: US 10,212,376 B2
(45) Date of Patent: Feb. 19, 2019

(54) SOLID-STATE IMAGING DEVICE AND ELECTRONIC APPARATUS

(71) Applicant: SONY CORPORATION, Tokyo (JP)

(72) Inventor: Hiroaki Ishiwata, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/972,307

(22) Filed: May 7, 2018

(65) Prior Publication Data

US 2018/0255261 A1 Sep. 6, 2018

Related U.S. Application Data

(63) Continuation of application No. 15/314,976, filed as application No. PCT/JP2015/066285 on Jun. 5, 2015, now Pat. No. 10,027,916.

(30) Foreign Application Priority Data

Jun. 16, 2014 (JP) ................................ 2014-123238

(51) Int. Cl.
*H04N 5/374* (2011.01)
*H04N 5/357* (2011.01)
(Continued)

(52) U.S. Cl.
CPC ... *H04N 5/37457* (2013.01); *H01L 27/14614* (2013.01); *H01L 27/14643* (2013.01); *H04N 5/357* (2013.01)

(58) Field of Classification Search
CPC .. H04N 5/37457; H04N 5/357; H04N 5/3658; H04N 5/3745; H01L 27/14603;
(Continued)

(56) References Cited

U.S. PATENT DOCUMENTS 7,858,912 B2  12/2010 Chan et al.
2009/0033782 A1  2/2009 Muroshima et al.
(Continued)

FOREIGN PATENT DOCUMENTS

CN  102792445 A  11/2012
CN  102956658 A  3/2013
(Continued)

OTHER PUBLICATIONS

Non-Final Office Action for U.S. Appl. No. 15/314,976, dated Nov. 3, 2017, 13 pages.
(Continued)

*Primary Examiner* — Lin Ye
*Assistant Examiner* — Marly Camargo
(74) *Attorney, Agent, or Firm* — Chip Law Group

(57) ABSTRACT

The present technology relates to a solid-state imaging device and an electronic apparatus that realize a high frame rate image capture without deteriorating an image quality. A floating diffusion holds a charge accumulated on one or more photoelectric conversion units. A plurality of amplification transistors read out a signal corresponding to the charge held by the floating diffusion. The signal read out by the amplification transistor is output to a vertical signal line. The plurality of amplification transistors are connected in parallel. The present technology is applicable to a CMOS image sensor, for example.

5 Claims, 18 Drawing Sheets

(51) Int. Cl.
*H01L 27/146* (2006.01)
*H04N 5/3745* (2011.01)

(58) Field of Classification Search
CPC ......... H01L 27/14612; H01L 27/14614; H01L 27/14641; H01L 27/14643
USPC ..... 348/308, 300, 301, 302, 294; 250/208.1, 250/214 A, 214 LA; 257/291, 292, 293, 257/159, E31.097; 374/173
See application file for complete search history.

(56) References Cited

U.S. PATENT DOCUMENTS

| 2010/0177226 | A1* | 7/2010 | Itonaga | H01L 27/14603 348/300 |
|---|---|---|---|---|
| 2011/0273601 | A1 | 11/2011 | Egawa | |
| 2012/0314109 | A1 | 12/2012 | Murakami et al. | |
| 2013/0049082 | A1* | 2/2013 | Kato | H04N 5/3745 257/292 |
| 2013/0050552 | A1* | 2/2013 | Oishi | H01L 27/14603 348/301 |
| 2013/0256509 | A1* | 10/2013 | Yang | H01L 27/14612 250/208.1 |
| 2015/0103218 | A1 | 4/2015 | Tanaka | |
| 2017/0201705 | A1* | 7/2017 | Ishiwata | H04N 5/37457 348/300 |
| 2018/0182794 | A1* | 6/2018 | Go | H01L 27/14612 |

FOREIGN PATENT DOCUMENTS

| JP | 11-026740 A | 1/1999 |
|---|---|---|
| JP | 2011-181595 A | 9/2011 |
| JP | 2013-045878 A | 3/2013 |
| JP | 2013-062789 A | 4/2013 |
| KR | 10-2013-0023075 A | 3/2013 |
| TW | 201310628 A | 3/2013 |
| WO | 2011/105043 A1 | 9/2011 |

OTHER PUBLICATIONS

Notice of Allowance for U.S. Appl. No. 15/314,976, dated Mar. 20, 2018, 16 pages.
International Search Report and Written Opinion of PCT Application No. PCT/JP2015/066285, dated Aug. 25, 2015, 10 pages of English Translation and 09 pages of ISRWO.
International Preliminary Report on Patentability of PCT Application No. PCT/JP2015/066285, dated Dec. 29, 2016, 10 pages of English Translation and 06 pages of IPRP.

* cited by examiner

PRIOR ART

SOLID-STATE IMAGING DEVICE AND ELECTRONIC APPARATUS

CROSS-REFERENCE TO RELATED APPLICATION

The present application is a continuation application of U.S. patent application Ser. No. 15/314,976, filed Nov. 30, 2016, which is a national stage entry of PCT/JP2015/066285, filed Jun. 5, 2015, which claims priority from prior Japanese Priority Patent Application JP 2014-123238 filed in the Japan Patent Office on Jun. 16, 2014, the entire contents of which are hereby incorporated by reference.

TECHNICAL FIELD

The present technology relates to a solid-state imaging device and an electronic apparatus, in particular to a solid-state imaging device and electronic apparatus that realize a high frame rate image capture.

BACKGROUND ART

In recent years, a pixel size of the solid-state imaging device has been miniaturized. A layout of transistors may cause a variation of sensitivity among a plurality of photodiodes within a shared pixel.

To oppose this, there is a solid-state imaging device that inhibits sensitivity from varying among a plurality of photodiodes within a shared pixel by adopting a pixel transistor layout having symmetrical two transistor regions and sharing eight pixels (see Patent Document 1).

In the meantime, a high frame rate image capture is performed by a digital video camera in the related art in order to acquire a slow motion video, and capture an object to be imaged that moves quickly in sports broadcasting or the like.

In order to realize the high frame rate image capture, it is necessary to output immediately a signal from an amplification transistor included in each pixel to a vertical signal line, and to shorten the time for stabilizing the signal in a CMOS (Complementary Metal Oxide Semiconductor) image sensor mounted to a digital video camera, for example.

In order to achieve this, it is known that transconductance gm of the amplification transistor may be increased. In order to increase the transconductance gm, it is also known that a gate length L of the amplification transistor may be decreased or a gate width W thereof may be increased.

Patent Document 1: Japanese Patent Application Laid-open No. 2013-62789

SUMMARY

Problem to be Solved

However, when the gate length L of the amplification transistor is decreased, or the gate width W thereof is increased, a random noise of the amplification transistor may be increased or a saturated signal amount of a pixel may be decreased, which may result in a deteriorated image quality.

The present technology is made in view of the circumstances as described above to realize a high frame rate image capture without deteriorating an image quality.

Means for Solving the Problem

A solid-state imaging device according to an aspect of the present technology includes one or more photoelectric conversion units; a floating diffusion that holds a charge accumulated on the photoelectric conversion units; a plurality of amplification transistors that read out a signal corresponding to the charge held by the floating diffusion; and a vertical signal line to which the signal read out by the amplification transistor is output, and the plurality of amplification transistors are connected in parallel.

A selection transistor that outputs the signal read out by the plurality of amplification transistors to the vertical signal line may be further included. The number of the selection transistor may be the same or less as the number of the plurality of amplification transistors. The plurality of amplification transistors may be connected to the vertical signal line via the selection transistor.

The plurality of amplification transistors may be formed on an identical active region.

The plurality of amplification transistors may be formed on different active regions, and an element separation region may be formed between the different active regions.

A threshold voltage of the selection transistor may be set lower than a threshold voltage of the plurality of amplification transistors.

A load transistor connected to the vertical signal line may by further included. On-resistance of the load transistor may be set smaller than a sum of on-resistance of the plurality of amplification transistors and on-resistance of the selection transistor.

The on-resistance of the load transistor may be set smaller than the sum of the on-resistance of the plurality of amplification transistors and the on-resistance of the selection transistor by setting the threshold voltage of the load transistor lower.

The on-resistance of the load transistor may be set smaller than the sum of the on-resistance of the plurality of amplification transistors and the on-resistance of the selection transistor by setting the threshold voltage of the load transistor higher.

The on-resistance of the load transistor may be set smaller than the sum of the on-resistance of the plurality of amplification transistors and the on-resistance of the selection transistor by setting a load current value of the load transistor smaller.

An electronic apparatus according an aspect of the present technology includes a solid-state imaging device, including one or more photoelectric conversion units, a floating diffusion that holds a charge accumulated on the photoelectric conversion units, a plurality of amplification transistors that read out a signal corresponding to the charge held by the floating diffusion, and a vertical signal line to which the signal read out by the amplification transistor is output, the plurality of amplification transistors being connected in parallel.

According to the aspect of the present technology, in a solid-state imaging device including one or more photoelectric conversion units, a floating diffusion that holds a charge accumulated on the photoelectric conversion units, a plurality of amplification transistors that read out a signal corresponding to the charge held by the floating diffusion, and a vertical signal line to which the signal read out by the amplification transistor is output, the plurality of amplification transistors are connected in parallel.

Effects

According to the aspect of the present technology, it becomes possible to realize a high frame rate image capture without deteriorating the image quality.

DESCRIPTION OF PREFERRED EMBODIMENTS

<Problems in Solid-State Imaging Device in the Related Art>

Before the embodiments of the present technology are described, problems in a solid-state imaging device in the related art will be described.

Figure 1A:
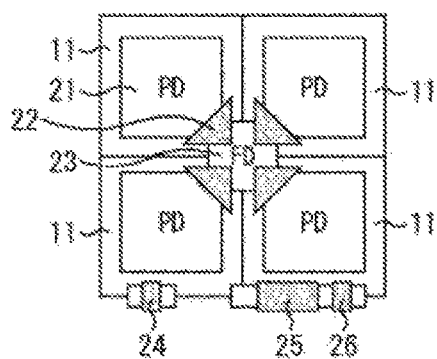
FIGS. 1A, 1B and 1C are views for explaining problems of a solid-state imaging device in the related art.
Figure 1B:
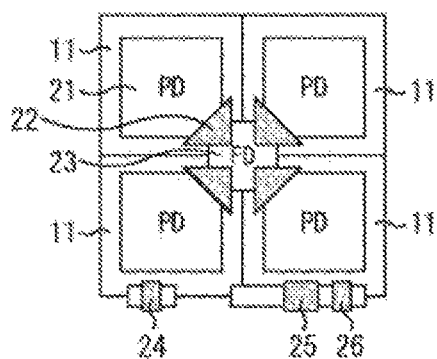
Figure 1C:
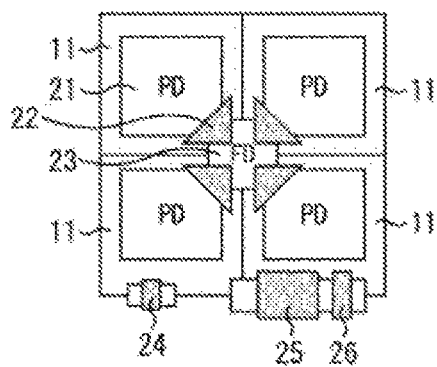

FIGS. 1A, 1B and 1C are plan views showing a layout example of a pixel of a solid-state imaging device in the related art.

FIG. 1A shows four pixels 11, each pixel 11 shares four pixels of vertical two pixels and horizontal two pixels.

Each pixel 11 includes a photodiode (PD) 21 as a photoelectric conversion unit, transfer transistor 22, a floating diffusion (FD) 23, a reset transistor 24, an amplification transistor 25, and a selection transistor 26. Among these, the FD 23, the reset transistor 24, the amplification transistor 25, and the selection transistor 26 are shared by the four pixels 11.

To realize a high frame rate image capture, it is known that transconductance gm of an amplification transistor may be increased. It is also known that the transconductance gm is increased by decreasing a gate length L of the amplification transistor or increasing a gate width W thereof.

In general, it is known that a random noise of the amplification transistor is inversely proportional to a product of the gate length L and the gate width W of the amplification transistor. Accordingly, as shown FIG. 1B, when the gate length L of the amplification transistor 25 is decreased, the random noise of the amplification transistor 25 is increased.

On the other hand, as shown in FIG. 1C, when the gate width W of the amplification transistor 25 is increased, it is necessary to narrow a region of a PD 21 formed near the amplification transistor 25, thereby decreasing a saturated signal amount of the pixel 11.

Thus, in order to increase the transconductance gm, the gate length L of the amplification transistor is decreased or the gate width W thereof is increased, which may deteriorate an image quality.

<Configuration Example of Solid-State Imaging Device>

Figure 2:
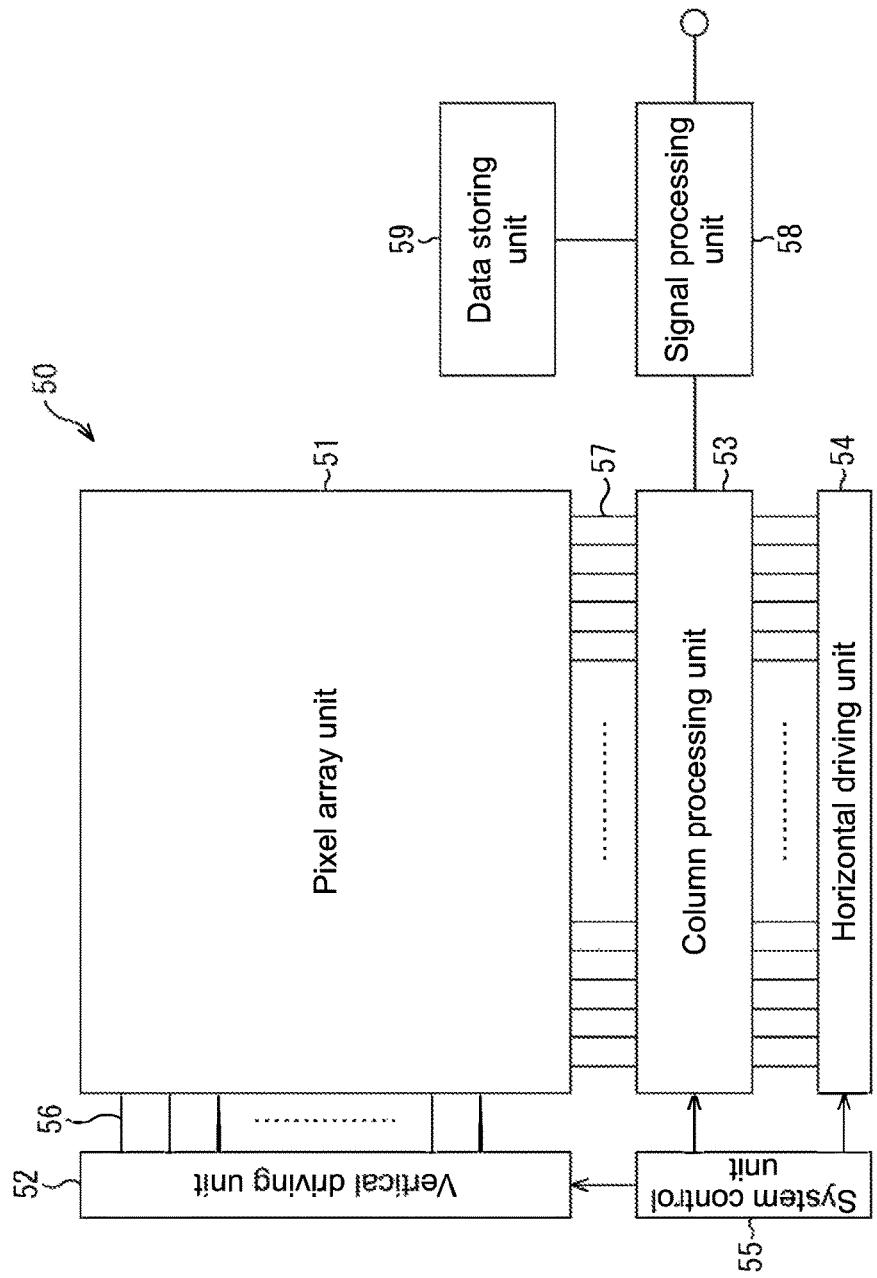
FIG. 2 is a block diagram of a solid-state imaging device to which the present technology is applied.

FIG. 2 is a block diagram showing an embodiment of a solid-state imaging device to which the present technology is applied. In the following, a configuration of a surface irradiation type CMOS (Complementary Metal Oxide Semiconductor) image sensor, which is one of an amplified solid-state imaging device, will be described. Note that the present technology is not limited to be applied to the surface irradiation type CMOS image sensor, and is also applicable to a rear surface irradiation type CMOS image sensor, other amplifying type solid-state imaging device, or a charge transfer type solid-state imaging device such as a CCD (Charge Coupled Device) image sensor.

A CMOS image sensor 50 shown in FIG. 2 has a configuration that includes a pixel array unit 51 formed on a semiconductor substrate (not shown), and a peripheral circuit unit accumulated on the same semiconductor substrate of the pixel array unit 51. The peripheral circuit unit is configured of a vertical driving unit 52, a column processing unit 53, a horizontal driving unit 54, and a system control unit 55, for example.

Furthermore, the CMOS image sensor 50 includes a signal processing unit 58 and a data storing unit 59.

The pixel array unit 51 has a configuration that unit pixels (hereinafter referred to simply as "pixels") are two-dimensionally arrayed in a row direction and a column direction, i.e., in a matrix. Each pixel includes a photoelectric conversion unit that generates and accumulates light charges corresponding to an amount of light received. Here, the row direction represents an arrangement direction (horizontal direction) of the pixels in a pixel row, and the column direction represents an arrangement direction (vertical direction) of the pixels in a pixel column.

In the pixel array unit 51, pixel driving lines 56 are wired along the row direction for every pixel row, and vertical signal lines 57 are wired along the column direction for every pixel column to the pixel arrangement in the matrix. The pixel driving lines 56 transmit driving signals for driving when the signals are read-out from the pixels.

The vertical driving unit 52 is configured of a shift resistor, an address decoder and the like, and drives all respective pixels of the pixel array unit 51 at the same time, in a row unit, or the like. In other words, the vertical driving unit 52 configures a driving unit for driving each pixel of the pixel array unit 51 together with the system control unit 55 that controls the vertical driving unit 52.

The signal output from each unit pixel in the pixel column selectively driven by the vertical driving unit 52 is input to the column processing unit 53 through each of the vertical signal lines 57 for every pixel column. The column processing unit 53 performs predetermined signal processing to the signal output from each pixel in a selection column through the vertical signal lines 57 for every pixel column of the pixel array unit 51, and temporary holds a signal-processed pixel signal.

Specifically, the column processing unit 53 performs at least a noise removal processing, for example, CDS (Correlated Double Sampling) processing as the signal processing. By the CDS processing of the column processing unit 53, a fixed pattern noise characteristic to the pixel such as a reset noise, a threshold variation of the amplification transistor within the pixel or the like is removed. It is also possible to provide the column processing unit 53 with, e.g., an AD (Analog-Digital) conversion function other than the noise removal processing, thereby converting an analog pixel signal into a digital signal to be output.

The horizontal driving unit 54 is configured of a shift resistor, an address decoder and the like, and selects in turn a unit circuit corresponding to the pixel column of the column processing unit 53. By the selective scanning of the horizontal driving unit 54, a pixel signal processed for every unit circuit in the column processing unit 53 is output in turn.

The system control unit 55 is configured of a timing generator that generates a variety of timing signals or the like, and performs a drive control of the vertical driving unit 52, the column processing unit 53, the horizontal driving unit 54 and the like on the basis of the variety of timing signals generated by the timing generator.

The signal processing unit 58 has at least an arithmetic processing function, and performs various signal processing such as arithmetic processing on a pixel signal output from the column processing unit 53. The data storing unit 59 temporary stores data needed for the signal processing at the signal processing unit 58.

Note that the signal processing unit 58 and the data storing unit 59 may be mounted on the same substrate (semiconductor substrate) as the CMOS image sensor 50, or may be disposed on a separate substrate from the CMOS image sensor 50. In addition, each processing of the signal processing unit 58 and the data storing unit 59 may be performed as external signal processing unit disposed on a separate substrate from the CMOS image sensor 50, e.g., processing by the DSP (Digital Signal Processor) circuit or software.

Furthermore, when the CMOS image sensor 50 is the rear surface irradiation type CMOS image sensor, it may be configured as a laminate type CMOS image sensor where a semiconductor substrate including the pixel array unit 51 is adhered to a semiconductor substrate including a logic circuit.

<Configuration Example of Pixel>

Figure 3:
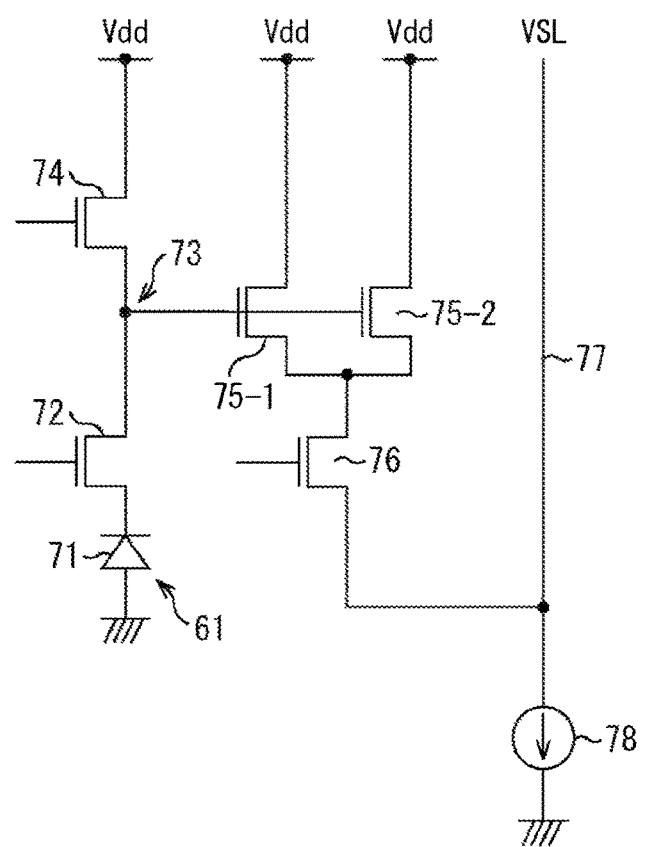
FIG. 3 is a circuit diagram showing a configuration example of a pixel of the solid-state imaging device.

FIG. 3 is a circuit diagram showing a configuration example of a pixel disposed on the pixel array unit 51.

As show in FIG. 3, the pixel 61 includes a photodiode (PD) 71 as a photoelectric conversion unit, a transfer transistor 72, a floating diffusion (FD) 73, a reset transistor 74, amplification transistors 75-1, 75-2, and a selection transistor 76. Note that any pixel transistor included in the pixel 61 is configured of an n type MOS transistor.

An anode of the PD 71 is grounded, and a cathode of the PD 71 is connected to a source of the transfer transistor 72. A drain of the transfer transistor 72 is connected to each gate of the amplification transistors 75-1, 75-2, and connection points configure the FD73.

The reset transistor 74 is connected between a predetermined power source Vdd and the FD73. Each drain of the amplification transistors 75-1, 75-2 are connected to the predetermined power source Vdd, and each source of the amplification transistors 75-1, 75-2 is connected to a drain of the selection transistor 76. In other words, the amplification transistors 75-1, 75-2 are connected in parallel. A source of the selection transistor 76 is connected to a vertical signal line (VSL) 77.

The vertical signal line 77 is connected to a constant current source 78 such that the amplification transistors 75-1, 75-2 and the constant current source 78 configure a source follower circuit.

In the pixel 61 having such a circuit configuration, a charge accumulated on the PD 71 is transferred to the FD 73 via the transfer transistor 72, and held. When the pixel 61 is to be read out, the selection transistor 76 is turned on, and the amplification transistors 75-1, 75-2 are source-follower driven, respectively. In this manner, the signal corresponding to the charge held in the FD 73 is read out by the amplification transistors 75-1, 75-2 as a pixel signal of the pixel 61, and outputs to the vertical signal line 77. The charge held in the FD 73 is reset by turning out the reset transistor 74.

<Layout Example of Pixel>

Figure 4A:
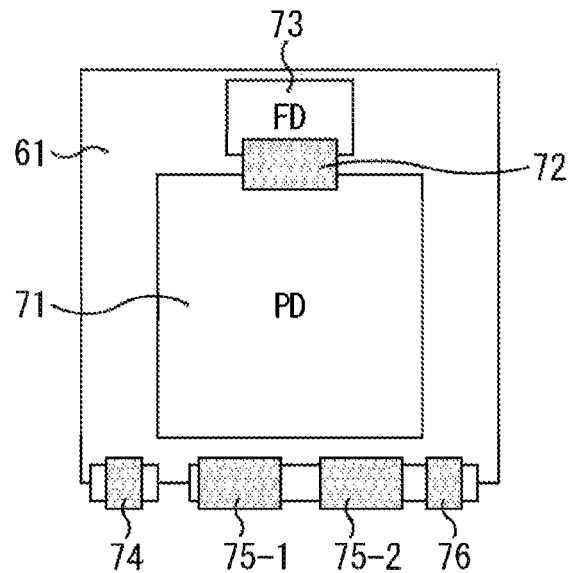
FIGS. 4A and 4B are plan views showing a layout example of a pixel of the solid-state imaging device.
Figure 4B:
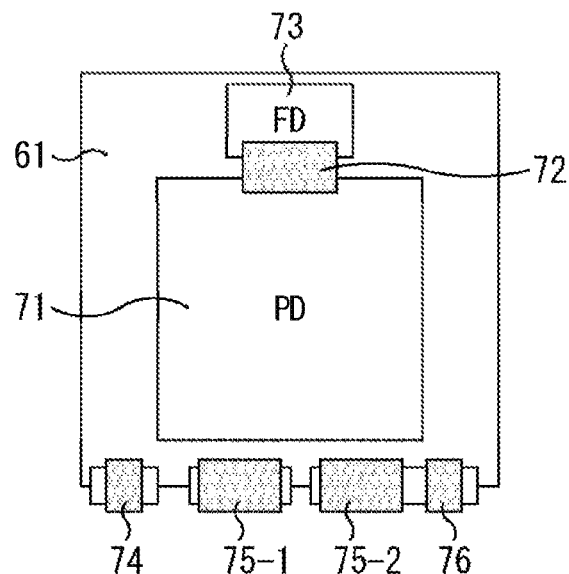

FIGS. 4A and 4B are plan views showing a layout example of the pixel 61. In FIGS. 4A and 4B, components corresponding to those in FIG. 3 are denoted by the same reference numerals, and thus detailed description thereof will be hereinafter omitted.

In FIG. 4A, the amplification transistors 75-1, 75-2 and the selection transistor 76 are formed on an identical active region.

On the other hand, in FIG. 4B, the amplification transistor 75-1, the amplification transistor 75-2 and the selection transistor 76 are formed on different active regions. Between each of the active regions, an element separation region is formed.

Although not shown, the power sources Vdd connected to each of the amplification transistors 75-1, 75-2 may be disposed in two places.

In the above-described configuration, the amplification transistors 75-1, 75-2 are connected in parallel, which will be equivalent to a state that the gate width W of the amplification transistor is increased. Thus, actually without decreasing the gate length L of the amplification transistor and without increasing the gate width W thereof, the gate width W of the amplification transistor may be increased, and transconductance gm of the amplification transistor may be increased. As a result, a high frame rate image capture is possible without deteriorating the image quality.

In the above, the signal read out by the amplification transistors 75-1, 75-2 is output to the vertical signal line 77 via one selection transistor 76, but may be output to the vertical signal line 77 via a plurality of selection transistors.

<Other Configuration Example of Pixel>

Figure 5:
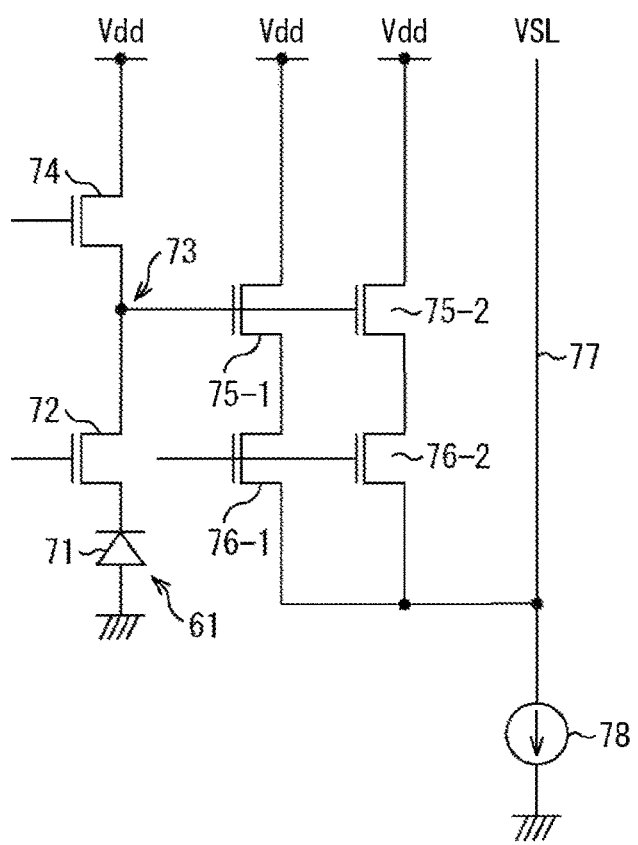
FIG. 5 is a circuit diagram showing a configuration example of a pixel of the solid-state imaging device.

FIG. 5 is a circuit diagram showing other configuration example of the pixel.

In FIG. 5, components corresponding to those in FIG. 3 are denoted by the same reference numerals, and thus detailed description thereof will be hereinafter omitted.

That is to say, the configuration shown in FIG. 5 is different from the configuration shown in FIG. 3 in that two selection transistors 76-1, 76-2 are disposed instead of one selection transistor 76. Specifically, the amplification transistors 75-1, 75-2 are connected to the vertical signal line 77 via the selection transistors 76-1, 76-2 respectively. The selection transistors 76-1, 76-2 are driven at the same time so as to output the signals read out by the amplification transistors 75-1, 75-2 to the vertical signal line 77.

<Other Layout Example of Pixel>

Figure 6A:
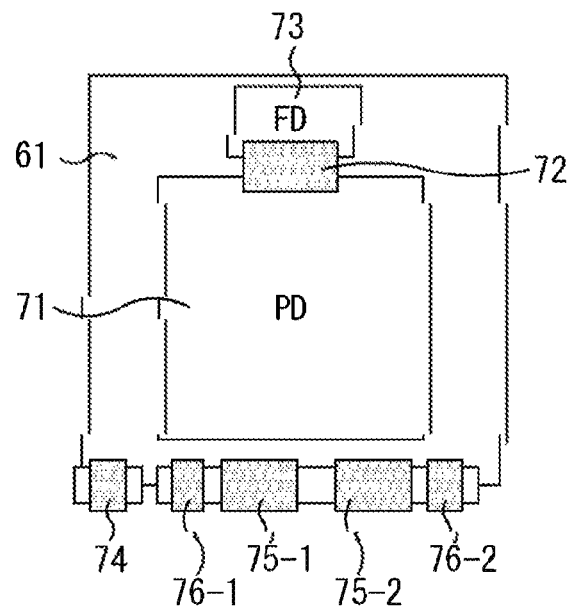
FIGS. 6A and 6B are plan views showing a layout example of a pixel of the solid-state imaging device.
Figure 6B:
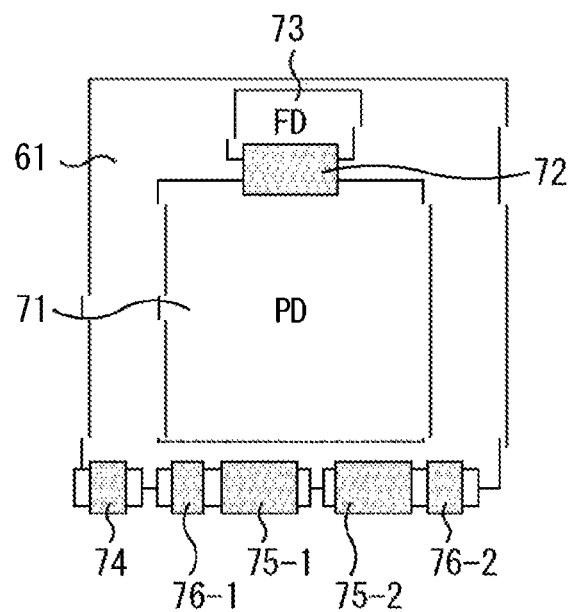

FIGS. 6A and 6B are plan views showing a layout example of the pixel 61 shown in FIG. 5. In FIGS. 6A and 6B, components corresponding to those in FIG. 5 are denoted by the same reference numerals, and thus detailed description thereof will be hereinafter omitted.

In FIG. 6A, the amplification transistors 75-1, 75-2 and the selection transistors 76-1, 76-2 are formed on an identical active region.

On the other hand, in FIG. 6B, the amplification transistor 75-1 and the selection transistor 76-1, and the amplification transistor 75-2 and the selection transistor 76-2 are formed on different active regions. Between each of the active regions, an element separation region is formed.

Although not shown, the power sources Vdd connected to each of the amplification transistors 75-1, 75-2 may be disposed in two places.

Also in the above-described configuration, the amplification transistors 75-1, 75-2 are connected in parallel, which will be equivalent to a state that the gate width W of the amplification transistor is increased. Thus, the transconductance gm of the amplification transistor may be increased. As a result, a high frame rate image capture is possible without deteriorating the image quality.

Note that the present technology is also applicable to a pixel sharing type solid-state imaging device.

<Configuration Example of Pixel Sharing Type Pixel>

Figure 7:
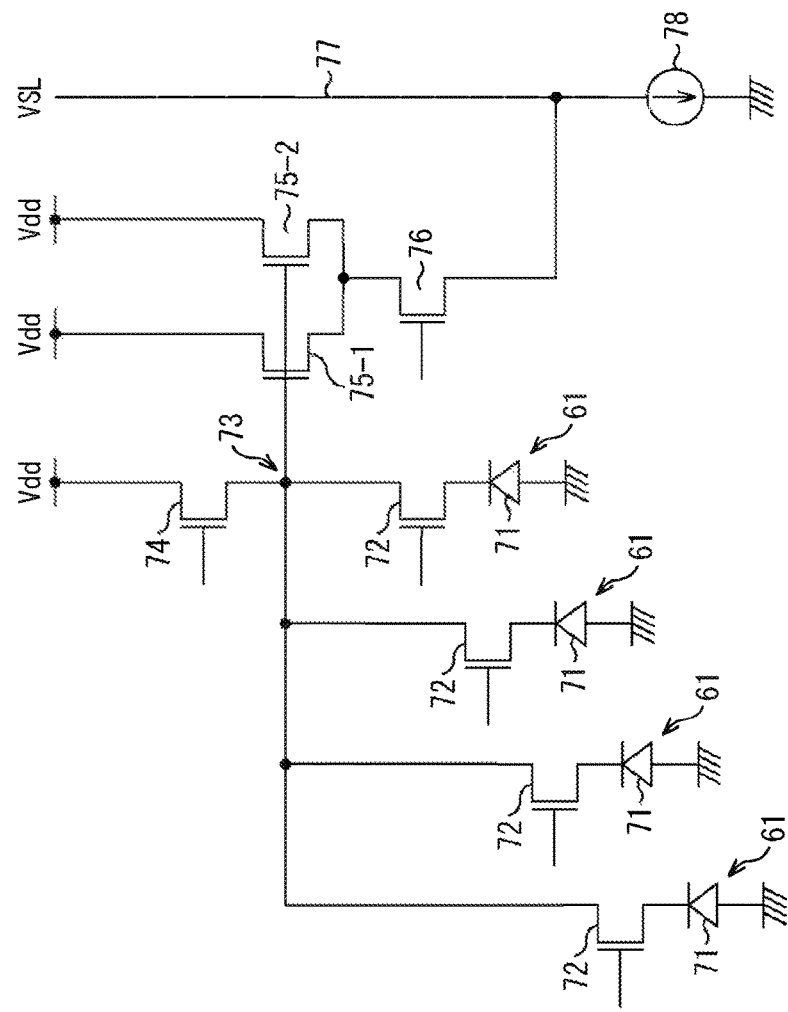
FIG. 7 is a circuit diagram showing a configuration example of a pixel sharing type pixel.

FIG. 7 is a circuit diagram showing a configuration example of a pixel of a four-pixel sharing type solid-state imaging device including vertical two pixels and horizontal two pixels.

In FIG. 7, components corresponding to those in FIG. 3 are denoted by the same reference numerals, and thus detailed description thereof will be hereinafter omitted.

As shown in FIG. 7, four pixels 61 include PDs 71, transfer transistors 72, an FD 73, a reset transistor 74, amplification transistors 75-1, 75-2, and a selection transistor 76. The FD 73, the reset transistor 74, the amplification transistors 75-1, 75-2, and the selection transistor 76 are shared by the four pixels 61.

<Layout Example of Pixel Sharing Type Pixel>

Figure 8A:
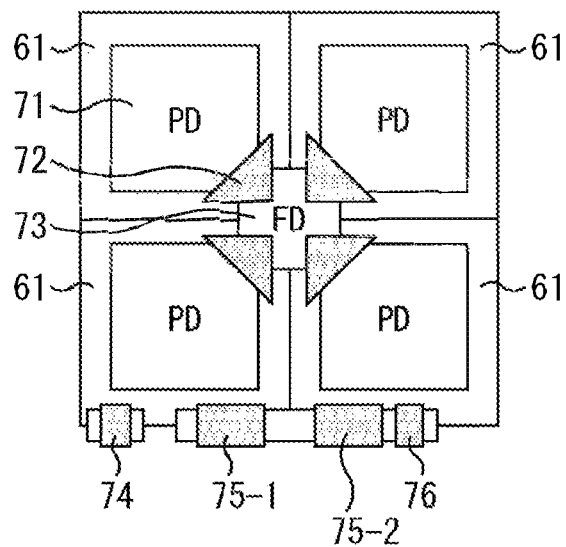
FIGS. 8A and 8B are plan views showing a layout example of a pixel sharing type pixel.
Figure 8B:
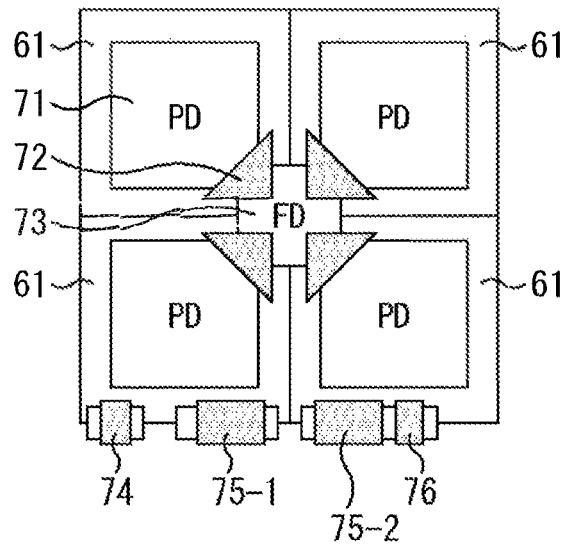

FIGS. 8A and 8B are plan views showing a layout example of the four-pixel sharing type pixel 61 shown in FIG. 7. In FIGS. 8A and 8B, components corresponding to those in FIG. 7 are denoted by the same reference numerals, and thus detailed description thereof will be hereinafter omitted.

In FIG. 8A, the amplification transistors 75-1, 75-2 and the selection transistor 76 are formed on an identical active region.

On the other hand, in FIG. 8B, the amplification transistor 75-1, the amplification transistor 75-2, and the selection transistor 76 are formed on different active regions. Between each of the active regions, an element separation region is formed.

In the example shown in FIGS. 8A and 8B, the amplification transistors 75-1, 75-2 are disposed not across a plurality of PDs 71 within a common pixel.

Although not shown, the power sources Vdd connected to each of the amplification transistors 75-1, 75-2 may be disposed in two places.

Also in the above-described configuration, the amplification transistors 75-1, 75-2 are connected in parallel, which will be equivalent to a state that the gate width W of the amplification transistor is increased. Thus, the transconductance gm of the amplification transistor may be increased. As a result, a high frame rate image capture is possible without deteriorating the image quality.

<Other Configuration Example of Pixel Sharing Type Pixel>

Figure 9:
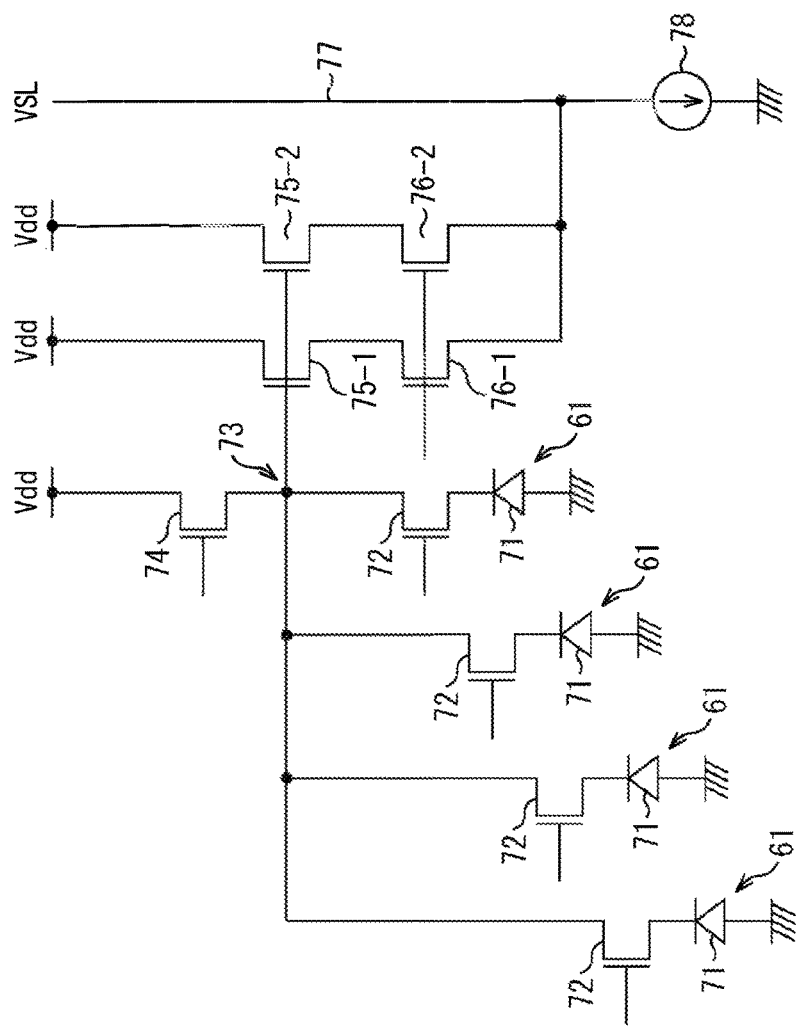
FIG. 9 is a circuit diagram showing a configuration example of a pixel sharing type pixel.

FIG. 9 is a circuit diagram showing other configuration example of a pixel sharing type pixel.

In FIG. 9, components corresponding to those in FIG. 7 are denoted by the same reference numerals, and thus detailed description thereof will be hereinafter omitted.

That is to say, the configuration shown in FIG. 9 is different from the configuration shown in FIG. 7 in that two selection transistors 76-1, 76-2 are disposed instead of one selection transistor 76. Specifically, the amplification transistors 75-1, 75-2 are connected to the vertical signal line 77 via the selection transistors 76-1, 76-2 respectively. The selection transistors 76-1, 76-2 are driven at the same time so as to output the signals read out by the amplification transistors 75-1, 75-2 to the vertical signal line 77.

<Other Layout Example of Pixel Sharing Type Pixel>

Figure 10A:
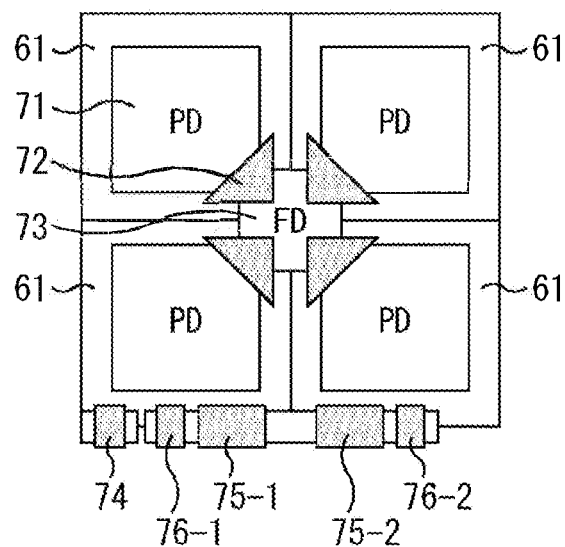
FIGS. 10A and 10B are plan views showing a configuration example of a pixel sharing type pixel.
Figure 10B:
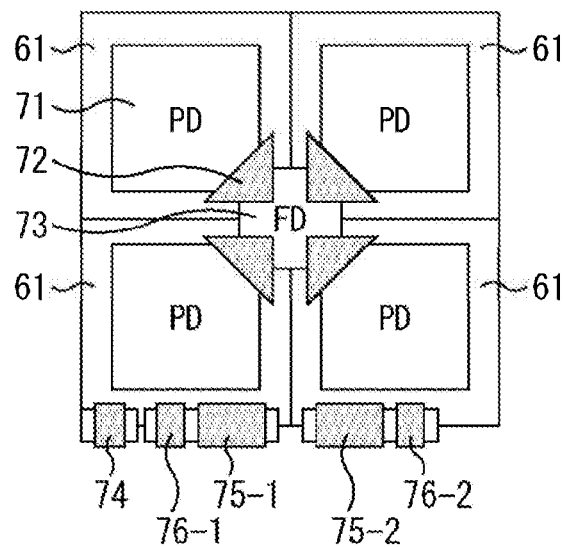

FIGS. 10A and 10B are plan views showing a layout example of the pixel sharing type pixel 61 shown in FIG. 9. In FIGS. 10A and 10B, components corresponding to those in FIG. 9 are denoted by the same reference numerals, and thus detailed description thereof will be hereinafter omitted.

In FIG. 10A, the amplification transistors 75-1, 75-2 and the selection transistors 76-1, 76-2 are formed on an identical active region.

On the other hand, in FIG. 10B, the amplification transistor 75-1 and the selection transistor 76-1, and the amplification transistor 75-2 and the selection transistor 76-2 are formed on different active regions. Between each of the active regions, an element separation region is formed.

In the example shown in FIGS. 10A and 10B, the amplification transistors 75-1, 75-2 are disposed not across the plurality of PDs 71 within the common pixel.

Although not shown, the power sources Vdd connected to each of the amplification transistors 75-1, 75-2 may be disposed in two places.

Also in the above-described configuration, the amplification transistors 75-1, 75-2 are connected in parallel, which will be equivalent to a state that the gate width W of the amplification transistor is increased. Thus, the transconductance gm of the amplification transistor may be increased. As a result, a high frame rate image capture is possible without deteriorating the image quality.

In the above-described configuration, two amplification transistors 75-1, 75-2 are connected in parallel. Three or more amplification transistors may be connected in parallel.

The number of the selection transistors connected to the plurality of amplification transistors connected in parallel may be the same or less as the amplification transistors. For example, when four amplification transistors are connected in parallel, four selection transistors may be provided that are connected to each of the four amplification transistors, or two selection transistors may be provided, one of them is connected to two amplification transistors.

<Problems and Countermeasures in Parallel Connection of a Plurality of Amplification Transistors>

As described above, by connecting the plurality of amplification transistors in parallel, the transconductance gm of the amplification transistor may be increased.

However, by connecting the plurality of amplification transistors in parallel, there is a problem that linearity of the selection transistor may be deteriorated.

Figure 11:
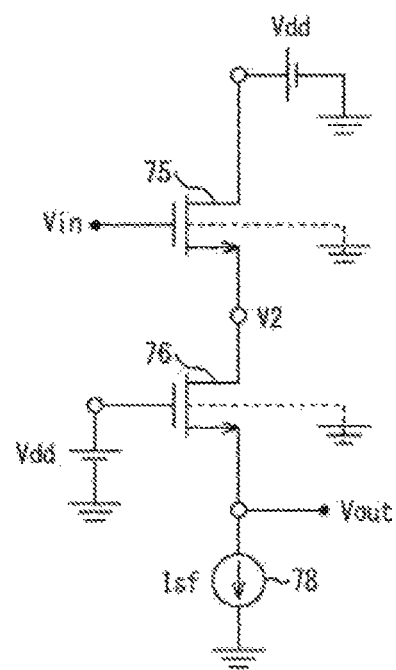
FIG. 11 is a circuit diagram showing a part of a pixel configuration in the related art.

FIG. 11 is a circuit diagram showing a configuration example of a part of a pixel configuration in the related art. In FIG. 11, only the amplification transistor 75, the selection transistor 76, and the constant current source 78 are shown.

Here, in FIG. 11, when the gate length of the amplification transistor 75 is represented by L, the gate width thereof is represented by W, a threshold voltage is represented by Vth_amp, an input voltage (gate voltage) is represented by Vin, and a voltage between the amplification transistor 75 and the selection transistor 76 is represented by V2, a drain current Isf is represented by the following equation (1).

[Mathematical 1]

$$Isf = K\frac{W}{L}(Vin - V2 - \text{Vth\_amp})^2 \qquad (1)$$

In the equation (1), K is represented by a product μCox of mobility μ and a gate capacity Cox of the amplification transistor 75.

Figure 12:
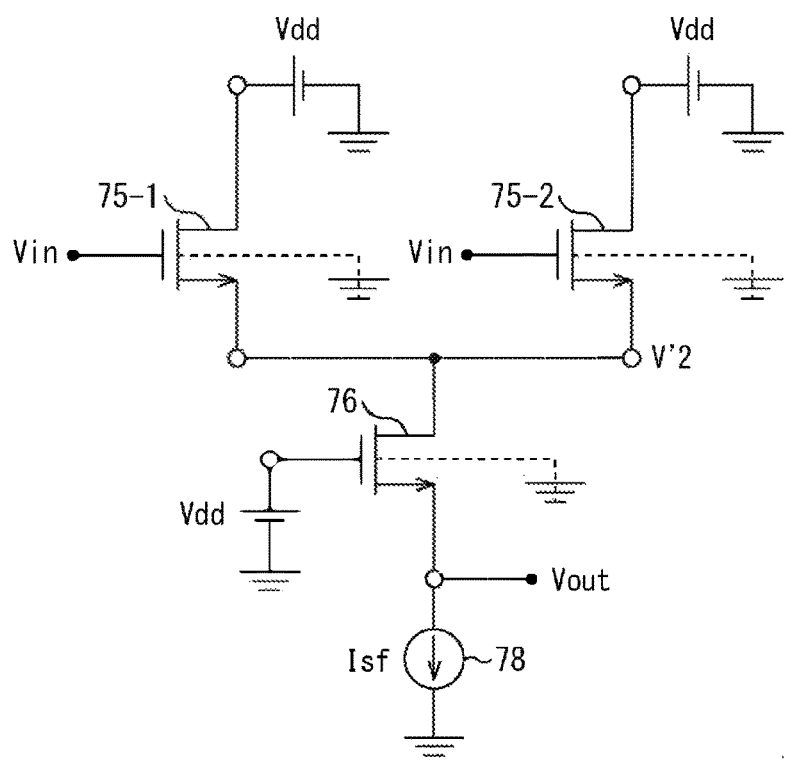
FIG. 12 is a circuit diagram showing a part of a pixel configuration to which the present technology is applied.

On the other hand, FIG. 12 is a circuit diagram showing a configuration example of a part of a pixel configuration including two amplification transistors connected in parallel. In FIG. 12, only the amplification transistors 75-1, 75-2, the selection transistor 76, and the constant current source 78 are shown.

Note that the amplification transistors 75-1, 75-2, the selection transistor 76, and the constant current source 78 shown in FIG. 12 have the same specifications and properties as the amplification transistor 75, the selection transistor 76, and the constant current source 78 shown in FIG. 11.

Here, in FIG. 12, when a threshold voltage of the amplification transistors 75-1, 75-2 is represented by V'th_amp, and a voltage between the amplification transistors 75-1, 75-2 and the selection transistor 76 is represented by V'2, a drain current Isf is represented by the following equation (2).

[Mathematical 2]

$$Isf = K\frac{2W}{L}(Vin - V'2 - \text{V'th\_amp})^2 \qquad (2)$$

In the configuration to which the present technology is applied, by connecting the amplification transistors 75-1, 75-2 in parallel, which will be equivalent to a state that the gate width W of the amplification transistor is twice, a term of the gate width W in the equation (1) becomes 2W in the equation (2).

In FIG. 11 and FIG. 12, when equal drain current Isf flows, and Vth_amp in the equation (1) is equal to V'th_amp in the equation (2), relationship between V2 in the equation (1) and V'2 in the equation (2) is represented as V2<V'2. This is because as the transconductance gm of the amplification transistor is increased, on-resistance of the amplification transistor is decreased.

Figure 13:
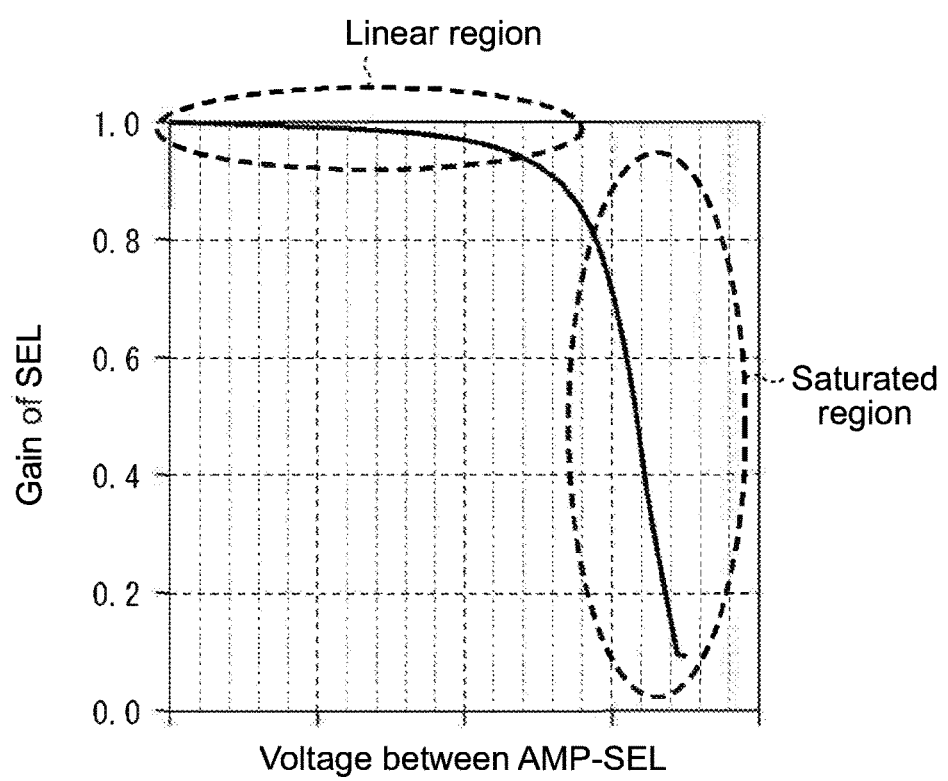
FIG. 13 is a view for explaining linearity deterioration of a gain of a selection transistor.

When the voltage between the amplification transistor (AMP) and the selection transistor (SEL) is increased, an action region of the selection transistor shifts from a linear region to a saturated region as shown in FIG. 13, the gain of the selection transistor is reduced, and the linearity is deteriorated.

According to the embodiment of the present technology, the threshold voltage of the selection transistor is set lower than the threshold voltage of the plurality of the amplification transistors. In this manner, even when the plurality of the amplification transistors are connected in parallel, the voltage between AMP-SEL can be low, whereby it is possible to avoid the linearity deterioration of the selection transistor.

Note that the threshold voltage of the pixel transistor is controlled by a dope amount upon ion implantation of the transistor formation.

<Problems and Countermeasures when Threshold Voltage of Selection Transistor is Set Lower than Threshold Voltage of Amplification Transistor>

As described above, when the threshold voltage of the selection transistor is set lower than the threshold voltage of the amplification transistor, it is possible to avoid the linearity deterioration of the selection transistor.

However, by setting the threshold voltage of the selection transistor is lower than the threshold voltage of the plurality of the amplification transistors, on-resistance variation of a load MOS transistor as a constant current source becomes noticeable. There is a problem that a so-called vertical streak is generated in the pixel column.

Figure 14C:
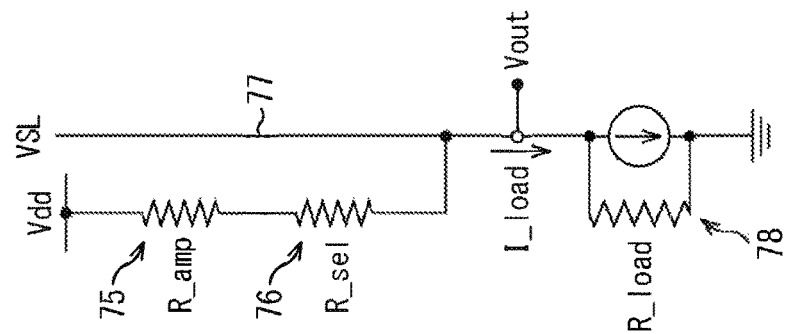
FIGS. 14A, 14B and 14C are views for explaining on-resistance variation of a load MOS transistor.
Figure 14B:
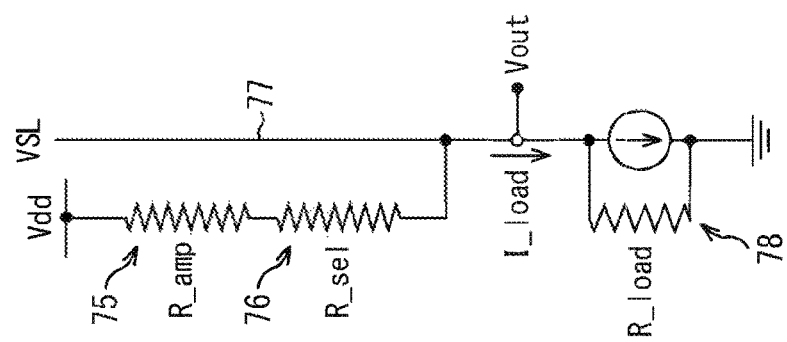
Figure 14A:
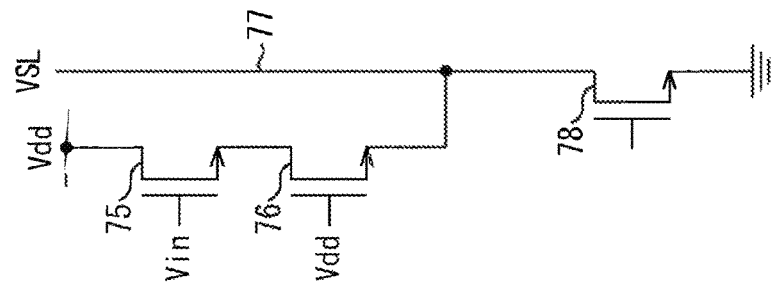

FIGS. 14A, 14B and 14C are views for explaining the on-resistance variation of the load MOS transistor as the constant current source.

FIG. 14A is a circuit diagram showing a part of a pixel configuration including one amplification transistor, and the amplification transistor 75, the selection transistor 76, the vertical signal line 77, and the constant current source 78 are shown.

FIG. 14B is a circuit diagram showing an equivalent circuit shown in FIG. 14A. As shown in FIG. 14B, on-resistance of the amplification transistor 75 is represented by R_amp, on-resistance of the selection transistor 76 is represented by R_sel, on-resistance of the load MOS transistor as the constant current source 78 is represented by R_load, and a power supply voltage is represented by Vdd, a source follower output Vout that is an output of the vertical signal line 77 is represented by the following equation (3).

[Mathematical 3]

$$Vout = \frac{R\_load}{R\_load + R\_amp + R\_sel}Vdd \qquad (3)$$

Here, as described above, when the transconductance gm of the amplification transistor is increased, and the threshold voltage of the selection transistor is lower than the threshold voltage of the amplification transistor, on-resistance R_amp of the amplification transistor 75 and on-resistance R_sel of the selection transistor 76 become small, as shown in FIG. 14C. In FIGS. 14A, 14B and 14C, the number of jags that are symbols showing the resistance represents a resistance value. The same applies to the following.

In the formula (3), when the on-resistance R_amp of the amplification transistor 75 and the on-resistance R_sel of the selection transistor 76 are decreased, the on-resistance R_load of the load MOS transistor is increased relatively. As the on-resistance of the load MOS transistor has originally variation for every pixel column, the variation will become noticeable. As a result, a so-called vertical streak is generated in the pixel column.

According to the embodiment of the present technology, the on-resistance of the load MOS transistor is set smaller than a sum of the on-resistance of the amplification transistor and the on-resistance of the selection transistor.

Figure 15B:
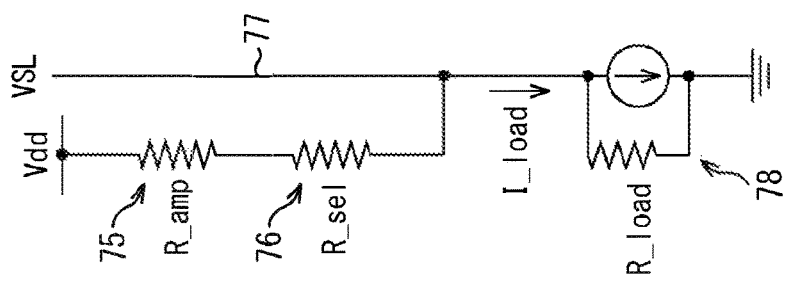
FIGS. 15A and 15B are views showing a specific example of decreasing on-resistance of the load MOS transistor.
Figure 15A:
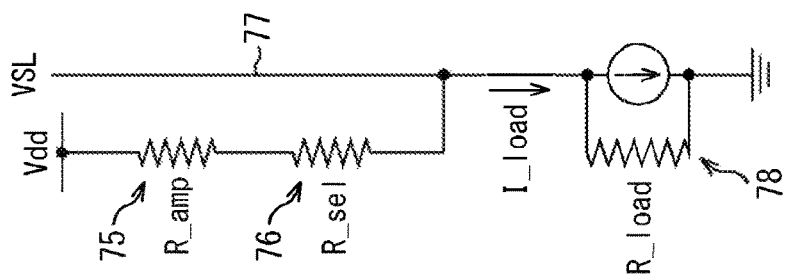

Specifically, by setting the threshold voltage of the load MOS transistor as the constant current source 78 lower, the on-resistance R_load of the load MOS transistor shown in FIG. 15A is decreased as shown in FIG. 15B.

Figure 16B:
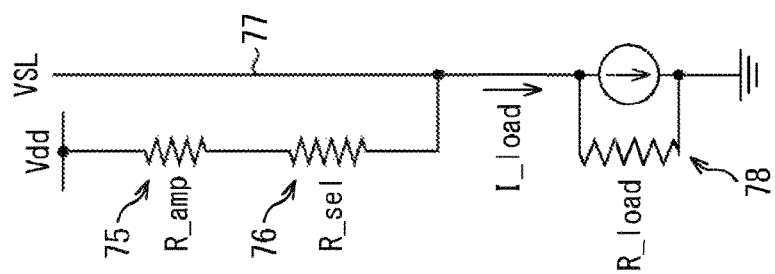
FIGS. 16A and 16B are views showing a specific example of decreasing on-resistance of the load MOS transistor.
Figure 16A:
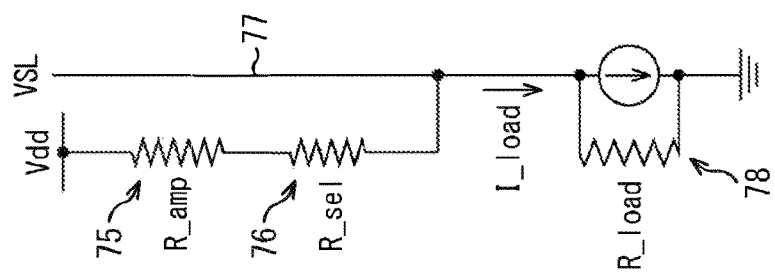

Also, by setting the threshold voltage of the amplification transistor 75 (in this embodiment, the plurality of the amplification transistors connected in parallel) higher, the on-resistance R_amp of the amplification transistor 75 shown in FIG. 16A is increased as shown in FIG. 16B.

Figure 17B:
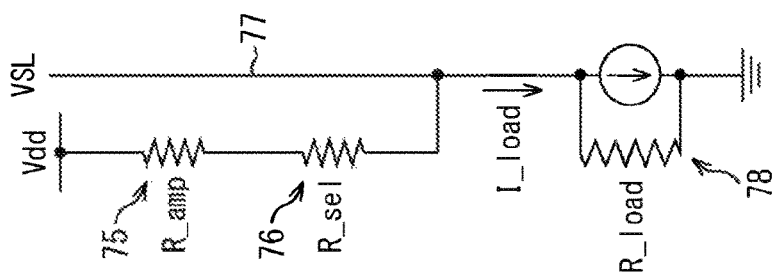
FIGS. 17A and 17B are views showing a specific example of decreasing on-resistance of the load MOS transistor.
Figure 17A:
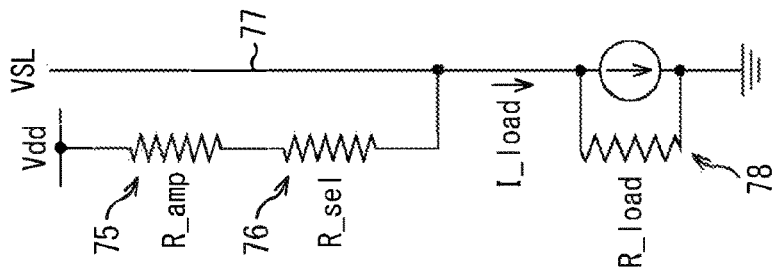

Furthermore, by setting a current value of a load current I_load flowing through the load MOS transistor as the constant current source 78 smaller, the on-resistance R_amp of the amplification transistor 75 and the on-resistance R_sel of the selection transistor may be increased as shown in FIG. 17B.

In this manner, the on-resistance of the load MOS transistor becomes smaller relatively as compared to the on-resistance of the amplification transistor and the on-resistance of the selection transistor. As a result, the on-resistance of the load MOS transistor becomes not noticeable, and it is possible to inhibit a vertical streak from generating for the pixel column.

<Configuration Example of Electronic Apparatus>

Next, referring to FIG. 18, a configuration example of an electronic apparatus to which the present technology is applied will be described.

Figure 18:
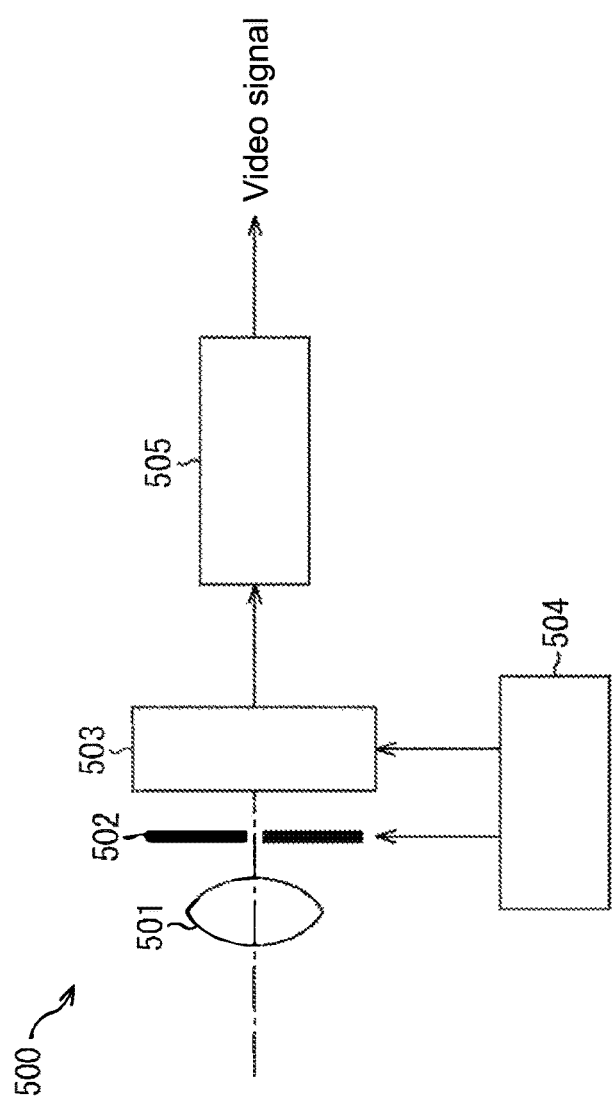
FIG. 18 is a block diagram showing a configuration example of an electronic apparatus to which the present technology is applied.

An electronic apparatus 500 shown in FIG. 18 includes an optical lens 501, a shutter apparatus 502, a solid-state imaging device 503, a driving circuit 504, and a signal processing circuit 505. FIG. 18 shows the configuration that the CMOS image sensor 50 having the pixels in the above-described embodiment is disposed at an electronic apparatus (for example, digital still camera) as the solid-state imaging device 503.

The optical lens 501 captures image light (incident light) from an object to be imaged on an imaging surface of the solid-state imaging device 503. In this manner, a signal charge is accumulated for a certain period of time within the solid-state imaging device 503. The shutter apparatus 502 controls a light irradiation period and a light shield period for the solid-state imaging device 503.

The driving circuit 504 supplies the driving signal that controls a signal transfer operation of the solid-state imaging device 503 and a shutter operation of the shutter apparatus 502. By the driving signal (timing signal) supplied from the driving circuit 504, the solid-state imaging device 503 performs a signal transfer. The signal processing circuit 505 performs a variety of signal processing to the signal output from the solid-state imaging device 503. A video signal on which the signal processing is performed is stored in a storage medium such as a memory or is output to a monitor.

In the electronic apparatus 500 according to the embodiment of the present technology, the solid-state imaging device 503 can realize a high frame rate image capture without deteriorating the image quality. Therefore, it becomes possible to acquire a slow motion video and capture an object to be imaged that moves quickly in sports broadcasting or the like.

The embodiments of the present technology are not limited to the above-described embodiments, and any modification is possible without departing from the scope of the present technology. The present technology may have the following configurations.

(1) A solid-state imaging device, including:
one or more photoelectric conversion units;
a floating diffusion that holds a charge accumulated on the photoelectric conversion units;
a plurality of amplification transistors that read out a signal corresponding to the charge held by the floating diffusion; and
a vertical signal line to which the signal read out by the amplification transistor is output, the plurality of amplification transistors being connected in parallel.

(2) The solid-state imaging device according to (1), further including
a selection transistor or selection transistors whose number is equal to or less than the number of amplification transistors, the selection transistor outputting the signal read out by the plurality of amplification transistors to the vertical signal line, in which
the plurality of amplification transistors are connected to the vertical signal line via the selection transistor.

(3) The solid-state imaging device according to (1) or (2), in which
the plurality of amplification transistors are formed on an identical active region.

(4) The solid-state imaging device according to (1) or (2), in which
the plurality of amplification transistors are formed on different active regions, and
an element separation region is formed between the different active regions.

(5) The solid-state imaging device according to any one of (1) to (4), in which
a threshold voltage of the selection transistor is set lower than a threshold voltage of the plurality of amplification transistors.

(6) The solid-state imaging device according to any one of (1) to (5), further including:
a load transistor connected to the vertical signal line, in which
on-resistance of the load transistor is set smaller than a sum of on-resistance of the plurality of amplification transistors and on-resistance of the selection transistor.

(7) The solid-state imaging device according to (6), in which
the on-resistance of the load transistor is set smaller than the sum of the on-resistance of the plurality of amplification transistors and the on-resistance of the selection transistor by setting the threshold voltage of the load transistor lower.

(8) The solid-state imaging device according to (6), in which
the on-resistance of the load transistor is set smaller than the sum of the on-resistance of the plurality of amplification transistors and the on-resistance of the selection transistor by setting the threshold voltage of the load transistor higher.

(9) The solid-state imaging device according to (6), in which
the on-resistance of the load transistor is set smaller than the sum of the on-resistance of the plurality of amplification transistors and the on-resistance of the selection transistor by setting a load current value of the load transistor smaller.

(10) An electronic apparatus, including:
a solid-state imaging device, including
one or more photoelectric conversion units,
a floating diffusion that holds a charge accumulated on the photoelectric conversion units,
a plurality of amplification transistors that read out a signal corresponding to the charge held by the floating diffusion, and
a vertical signal line to which the signal read out by the amplification transistor is output, the plurality of amplification transistors being connected in parallel.

DESCRIPTION OF REFERENCE NUMERALS

50 CMOS image sensor
51 pixel array unit 61 pixel
71 photodiode
73 floating diffusion
75-1, 75-2 amplification transistor
76, 76-1, 76-2 selection transistor
77 vertical signal line
78 constant current source
500 electronic apparatus
503 solid-state imaging device

The invention claimed is:

1. An imaging device, comprising:
a first photoelectric conversion unit;
a second photoelectric conversion unit;
a third photoelectric conversion unit;
a fourth photoelectric conversion unit;
a first transfer transistor;
a second transfer transistor;
a third transfer transistor;
a fourth transfer transistor;
a floating diffusion electrically connected to:
   the first photoelectric conversion unit through the first transfer transistor,
   the second photoelectric conversion unit through the second transfer transistor,
   the third photoelectric conversion unit through the third transfer transistor, and
   the fourth photoelectric conversion unit through the fourth transfer transistor;
a first amplification transistor, wherein a gate of the first amplification transistor is electrically connected to the floating diffusion;
a second amplification transistor, wherein a gate of the second amplification transistor is electrically connected to the floating diffusion;
a first selection transistor;
a second selection transistor; and
a vertical signal line electrically connected to the first amplification transistor via the first selection transistor, and the second amplification transistor via the second selection transistor.

2. The imaging device according to claim 1, wherein each of the first selection transistor and the second selection transistor is configured to be controlled simultaneously.

3. The imaging device according to claim 1, wherein the first and second amplification transistors are on an identical active region.

4. The imaging device according to claim 1, wherein the floating diffusion is configured to hold a charge accumulated on each of the first photoelectric conversion unit, the second photoelectric conversion unit, the third photoelectric conversion unit, and the fourth photoelectric conversion unit.

5. The imaging device according to claim 1, wherein the floating diffusion is surrounded by the first transfer transistor, the second transfer transistor, the third transfer transistor, and the fourth transfer transistor in a plan view.

* * * * *